United States Patent [19]
Hashimoto et al.

[11] Patent Number: 5,788,560
[45] Date of Patent: Aug. 4, 1998

[54] BACKING PAD AND METHOD FOR POLISHING SEMICONDUCTOR WAFER THEREWITH

[75] Inventors: Hiromasa Hashimoto, Fukushima-ken; Kenji Kasai, Gunma-ken; Taichi Ichikawa, Gunma-ken; Yuji Kawaura, Gunma-ken, all of Japan

[73] Assignee: Shin-Etsu Handotai Co., Ltd., Tokyo, Japan

[21] Appl. No.: 789,332

[22] Filed: Jan. 23, 1997

[30] Foreign Application Priority Data

Jan. 25, 1996 [JP] Japan ................................. 8-031293

[51] Int. Cl.$^6$ ............................................. B24B 5/00
[52] U.S. Cl. ................... 451/288; 451/41; 451/289; 451/364; 451/390; 451/398
[58] Field of Search ............................ 451/285–290, 451/41, 388, 390, 398, 364; 269/21, 304, 900, 289

[56] References Cited

U.S. PATENT DOCUMENTS

| | | | |
|---|---|---|---|
| 5,101,602 | 4/1992 | Hashimoto | 451/41 |
| 5,534,106 | 7/1996 | Cote et al. | 451/287 |
| 5,538,465 | 7/1996 | Netsu et al. | 451/289 |
| 5,573,448 | 11/1996 | Nakazima et al. | 451/287 |
| 5,605,499 | 2/1997 | Sugiyama et al. | 451/41 |

*Primary Examiner*—Robert A. Rose
*Assistant Examiner*—George Nguyen
*Attorney, Agent, or Firm*—Ronald R. Snider

[57] ABSTRACT

A backing pad for supporting semiconductor wafer allowing an advanced flatness of its mirror-polished surface even for large sized wafers. A backing pad 1 is smoothly finished on its wafer holding surface 1a, thereon a number of grooves 2, 2 ... aligned in a lattice form and elongated toward the outer periphery of the backing pad 1. The backing pad is typically made of polyurethane poromerics internally including a number of isolated pores. All of the grooves 2 are equal in the width and depth, which are kept constant along their lengthy direction. Intergroove pitch is also kept constant over the entire wafer holding surface 1a. The backing pad 1 is enlarged in its diameter to allow simultaneous loading of a plurality of wafers W, W . . . .

14 Claims, 2 Drawing Sheets

BACKING PAD AND METHOD FOR POLISHING SEMICONDUCTOR WAFER THEREWITH

The present disclosure relates to subject matter contained in Japanese patent application No.31293 Filed on Jan. 25, 1996) which is expressly incorporated herein by reference in its entirety.

BACKGROUND OF THE INVENTION

1. Field of the Invention

The present invention relates to a backing pad suitable for polishing semiconductor wafers by the waxless method and a polishing method for polishing semiconductor wafers therewith.

2. Description of the Related Art

Semiconductor wafers are mirror-polished generally in their finishing process by so-called mechanochemical polishing process. Most popular methods for supporting the wafers onto polishing carriers in this mirror polishing include the wax process and the waxless process, in which the former process involves the use of adhesion wax spread on one surface thereof, and the latter process involves either the use of vacuum chuck or water-aided adhesion on a backing pad made of porous resin such as polyurethane poromerics.

In the wax process, it is critical to make an adhesion layer in an uniform thickness since nonuniformity in the thickness of the adhesion layer would directly be reflected to flatness and parallelism of the finished wafer. Works for ensuring an uniform thickness of the adhesion layer are however very difficult. The wax process also suffers from complexity in the wafer process, since the wax need be removed from the wafer surface after the polishing. The waxless process can clear the above disadvantages in the wax process and enjoys merits in that wax coating onto and removal from the wafer are both unnecessitated.

As shown in FIG. 3, a polishing apparatus 31 used in the waxless process based on with water-aided adhesion comprises a polishing load 32, a template 33, a polishing pad 34 and a turn table 35. The template 33 further consists of a polishing plate 36, a backing pad 37 and a template blank 38, all of which layered in this order.

The polishing plate 36 is formed as a round ceramic plate. The backing pad 37 is made of polyurethane poromerics having a smooth bottom surface (facing to the turn table side) provided as a wafer holding surface 37a and a porous content with a great number of isolated pores. The template blank 38 refers to a laminated glass fiber plate impregnated, for example, with epoxy resin, and has engagement holes 38a bored therein for holding a wafer. The backing pad 37 is fixed on the polishing plate 36, the template blank 38 fixed on the backing pad 37, and the polishing pad 34 fixed on the turn table 35, respectively, using adhesive.

Before starting wafer polishing with this polishing apparatus, a semiconductor wafer W is fixed on the template 33 according to the procedures given below. First the wafer holding surface 37a of the backing pad 37 is applied with water at around the engagement holes 38a of the template blank 38, removed with excessive water, and toward which the back surface of a wafer is then pressed while supporting the wafer center so that the air is prevented from intruding between the wafer holding surface and the back surface (opposite to the surface to be polished) of the wafer. The semiconductor wafer W is, as shown in FIG. 3, adsorbed and fixed on the wafer holding surface 37a of the backing pad 37 assisted by surface tension of the water.

It is thus necessary for fixing the wafer to retain an appropriate amount of water in a gap formed between the wafer holding surface 37a and the back surface of the wafer. The conventional backing pad 37, however, could not prevent a few air or excessive water from intruding and being trapped in the gap at the time of wafer loading. Trapped air and water are indicated by symbol 51 in FIG. 1.

In recent years, diameter of semiconductor wafer is becoming larger and required flatness after polishing is thus becoming more stringent as compared with that for small-sized wafer. In larger wafers of 8 to 12-inches diameter, however, influences stronger than those on smaller wafers would be brought on the flatness of polished wafer by air or excessive water, not required for adsorbing the wafer, retained in the gap between the wafer holding surface of the backing pad and the back surface of the wafer. Larger wafers also suffered from difficulties in thoroughly removing the above air and the excessive water, thus making it difficult to produce large-sized polished wafers with an excellent flatness.

That is, when a backing pad of the conventional structure is used to polish a large-sized wafer, the above gap might trap the air and water 51 as shown in FIG. 4, thus allowing the wafer W to be polished as convexed toward the polishing pad 34, which would result in nonuniform thickness in the polishing stock removal 52. Thus the polished surface Wa of the wafer W would be concaved in its center since the center portion is polished excessively as compared with the peripheral portion, which has been pointed out as a demerit.

One solution of this problem employed a polyurethane poromerics-made backing pad as a wafer holding member to avoid trapping of the air or water into the gap. Most of the inner pores were, however, formed along the direction of the thickness of the backing pad and allowed only insufficient communications among the isolated pores, thus the air removal has been unsatisfactory.

SUMMARY OF THE INVENTION

It is therefore an object of the present invention to provide a backing pad which can ensure an excellent flatness of the mirror finished surface of wafers even when large-sized wafers are used.

It is another object of the present invention to provide a method for polishing semiconductor wafers using such backing pad.

In accordance with an aspect of the present invention, the above object is attained by providing a backing pad for supporting semiconductor wafer to be polished by the waxless method, which backing pad consists of a sheeted elastic member having a great number of grooves carved on the wafer holding surface.

When a semiconductor wafer is fixed on the backing pad of the present invention with aid of surface tension of water, the backing pad can, upon the wafer loading, automatically and quickly discharge the air and excessive water once trapped in the gap between the wafer holding surface of the backing pad and the back surface of the wafer.

In accordance with another aspect of the invention, the above object is attained by providing a method for polishing a semiconductor wafer based on the waxless method, in which the above-described backing pad is used for supporting the wafer.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENTS

The present invention will be detailed in connection with several preferred embodiments.

Figure 1:
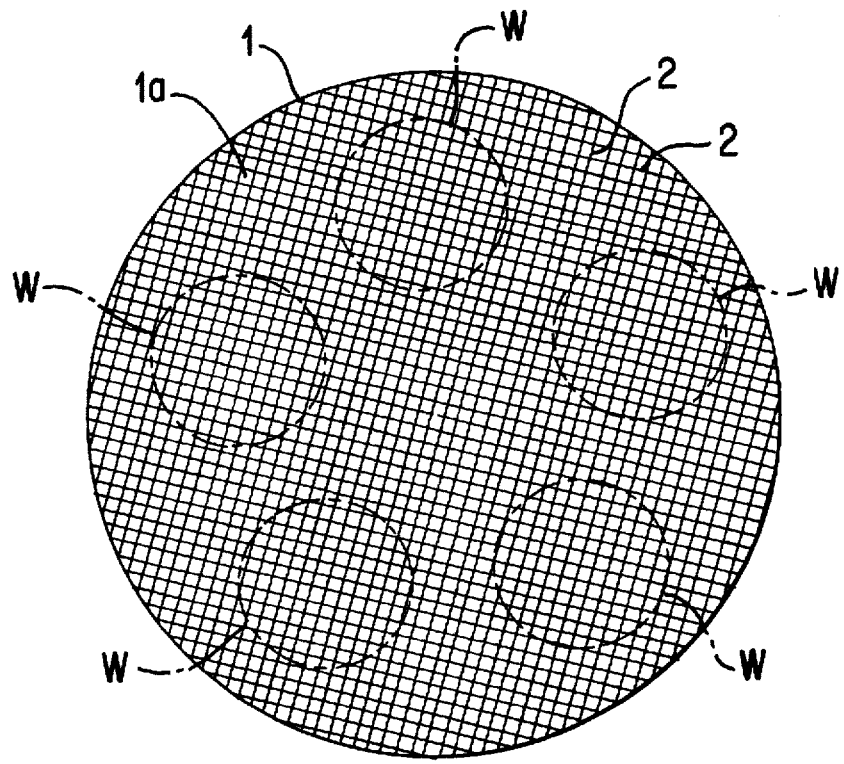
FIG. 1 shows a plan view for explaining a morphology of a backing pad in accordance with one embodiment.
Figure 2:
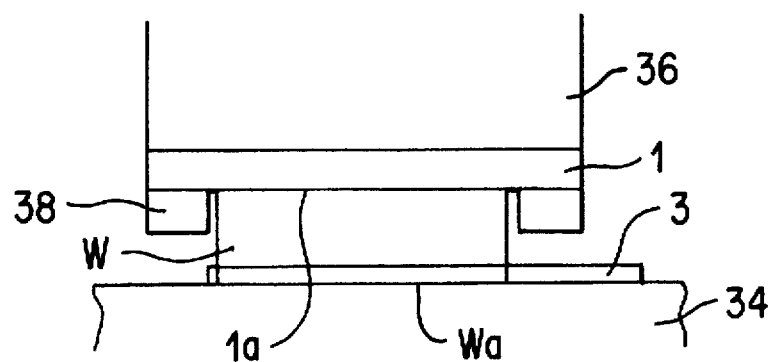
FIG. 2 shows a graphical sectional view for explaining action of a semiconductor wafer polishing using the backing pad as shown in FIG. 1 based on the waxless method.
Figure 3:
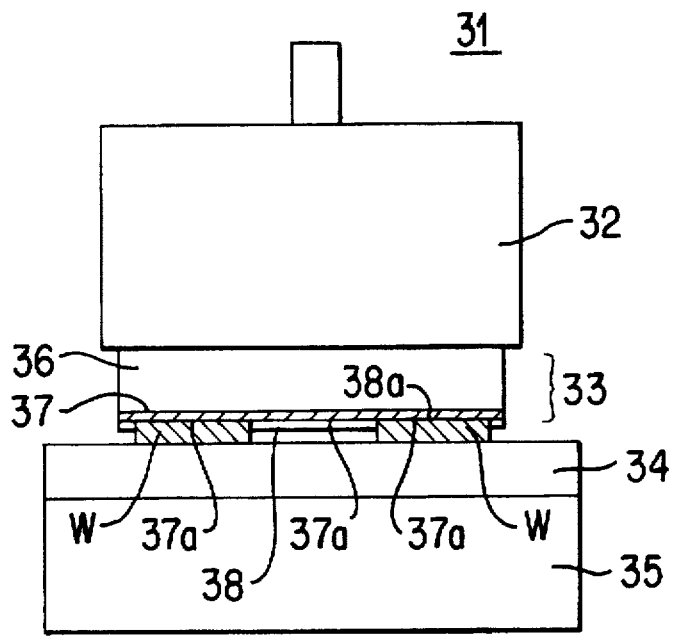
FIG. 3 shows a sectional view for explaining a semiconductor wafer polishing apparatus using the conventional backing pad based on the waxless method.
Figure 4:
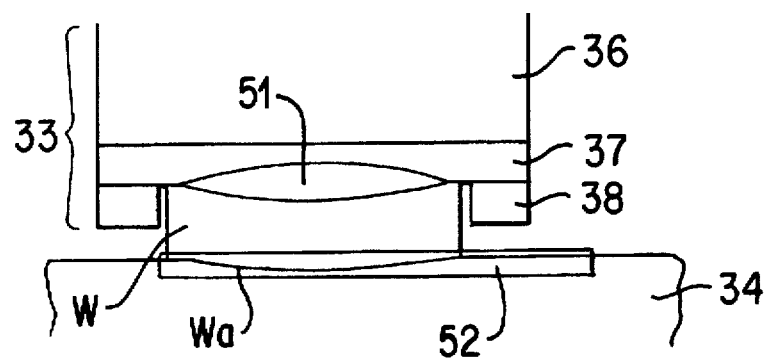
FIG. 4 shows a graphical sectional view for explaining action of a semiconductor wafer polishing using the backing pad as shown in FIG. 3 based on the waxless method.

FIG. 1 shows a plan view for explaining a morphology of a backing pad 1 observed from the side of its wafer holding surface 1a. FIG. 2 shows a graphical sectional view for explaining action of semiconductor wafer polishing using the backing pad 1 based on the waxless method.

A wafer holding surface 1a of the backing pad 1 is flat-finished by, for example, precision surface grinding, and on this flat plane a great number of grooves 2, 2 . . . are carved in a lattice form. All the grooves 2 run straight toward the outer periphery of the sheeted elastic member and have an equal width and an equal depth being kept in constant along the longitudinal direction. An intergroove pitch is also kept in constant over the entire of the wafer holding surface 1a. The backing pad is, as indicated for example by two-dot chain line in FIG. 1, formed in a diameter as large enough to simultaneously hold a plurality of wafers W, W . . . (five wafers in FIG. 1 for example). As a material for forming the sheeted elastic member, known materials including the above-mentioned polyurethane poromerics are available.

A most preferable layout of the groove 2 is referred as a square lattice, but an oblique lattice and parallel linear (stripe) pattern are also allowable by request. The present invention does not absolutely require that all the grooves 2 run throughout the edge of the sheeted elastic member as described above, but only require that all or nearly all of the grooves 2 reach at least to the edge of the wafers.

This is because a most critical matter relates to smooth discharge of the air and water trapped in a gap between the wafers and the wafer holding surface 1a of the backing pad 1 when the wafers are loaded. The grooves 2 are thus not necessarily be formed in straight but also in a curved form or in a combination of straight and curved forms.

The backing pad 1 was fabricated as described below.

A commercial sheeted uniform-thick elastic member made of polyurethane poromerics having internally a great number of isolated pores was employed, one surface of which was designated as a wafer holding surface (more correctly a surface functions as a wafer holding surface after fabricated into a backing pad), the wafer holding surface was buffed with a buffing machine, and the member was cut into a round shape with a predetermined diameter. The round plate was then fixed on a glass-made polishing plate with an adhesive, and smoothened on its wafer holding surface using a precision surface grinder (product of Shibayama Kikai Co., Ltd.). The wafer holding surface was irradiated with laser beam to carve a great number of grooves in a lattice form over the entire surface thereof.

The grooves are preferably formed in 0.3 to 3.0 mm width and in 5 to 30 mm pitch. This is because a too large groove width will impair the wafer flatness and a too small groove width will ruin the purpose of the groove. Too small intergroove pitch is not practical since the groove processing will be time-consuming, and too large pitch will ruin the purpose of its formation.

The intergroove pitch is preferably set as large or small in connection with the groove width. It is also favorable to alternate the size of the groove width and intergroove pitch depending on the diameter of wafers to be polished. For example, mirror polishing of 8-inch wafers (ca. 200 mm in diameter) will be successful by using a backing pad having grooves of 0.3 to 1 mm wide and 10 to 15 mm pitch, and of 10-inch wafers (ca. 250 mm in diameter) by using a backing pad having grooves of 0.3 to 1 mm wide and 5 to 10 mm pitch. This is most advantageous in ensuring a wafers with an excellent flatness without requiring any time-consuming processing of the grooves.

The depth of the groove 2 is preferably set equivalent as or close to the thickness of the backing pad (0.1 to 0.5 mm-thick) to enable thorough discharge of the air and water.

According to the semiconductor wafer polishing using the above backing pad 1 based on the waxless method, in which wafers are supported on the backing pad 1 with aid of surface tension of water, the air and the excessive water once trapped into a gap between the wafer holding surface 1a of the backing pad 1 and the back surface of each wafer W are automatically routed to the groove 2 and discharged from the edge of the wafers W.

This allows the polished surface Wa of the wafer W kept in parallel during the process with the polishing surface of the polishing pad 34, which will, without difficulty, result in an uniform thickness of a polishing allowance 3 and an advanced flatness in the polished surface of the wafer W.

In a typical polishing process of semiconductor wafers using a backing pad of the present invention, as shown in FIG. 1 or will be described later in [Test Example 1], diameter or other specifications of a single backing pad is so set that it can afford a plurality of wafers at the same time.

In another embodiment, a template blank bored with a plurality of through holes is fixed on the polishing plate and the backing pad is fixed thereon by insertion into these through holes, so that each backing pad can hold a single semiconductor wafer.

The following paragraphs describe, with reference to FIGS. 1 and 2, an example of test polishing in which silicon wafers of 8 inch diameter and 0.735 mm thick were polished using the backing pad described above in the embodiments.

[TEST EXAMPLE 1]

The round backing pad made of polyurethane poromerics as fabricated in the first embodiment and as shown in FIG. 1 was used. It was 565 mm diameter, 0.3 mm thick and having a pore size of 10 to 30 μm. The groove 2 aligned on the wafer holding surface of the backing pad in a lattice pattern (all openings of the lattice are square-shaped) had a intergroove pitch of 15 mm and a depth of 0.3 mm, both values being kept constant over the entire of the wafer holding surface, and its width and depth also kept unchanged within the longitudinal direction.

The round backing pad 1 was fixed on a ceramic polishing plate 36 having a nearly equal diameter using an adhesive, on which the epoxy resin-made template blank 38 having five engagement holes aligned on a single circumference for fixing wafers was fixed also with the adhesive. A surface area within which the through holes are exposed can thus serve as a wafer holding surface 1a.

The wafer holding surface 1a of the backing pad 1 was then applied with water, removed therefrom with an excessive water, and pressed thereto with the back surface of a wafer in such a manner that the wafer center being supported. The silicon wafer W was adherently fixed onto the backing pad 1 with aid of surface tension of water, while some air and excessive water trapped between the wafer holding surface 1a and the wafer back were automatically and quickly discharged through the grooves 2. The polished surface Wa was thus maintained in parallel with the polishing surface of the polishing pad 34.

After these preparatory steps before wafer polishing, the polishing load 32 was descended so that the polished surface Wa of the silicon wafer W is brought into contact and pressed with the polishing pad 34 at an predetermined pressure. Under a supply of polishing slurry (not shown) containing fine abrasive grain, the polishing load 32 was allowed to rotate as well as revolve, and the table 35 was rotated in the same direction as that for the rotation of the polishing load 32, to effect a simultaneous mirror polishing of five slices of silicon wafers.

Flatness of the polished surfaces of the wafers were evaluated in terms of LTVmax (in μm). LTVmax is defined as a maximum difference between a maximum value and a minimum value of thickness observed in a 20 mm×20 mm cell divided from a wafer, that is a maximum value of LTV (Local Thickness Variation). Results of the measurement using a general thickness gauge were shown in Table 1.

TABLE 1

|  | Silicon Wafer | | | | |
| --- | --- | --- | --- | --- | --- |
|  | 1 | 2 | 3 | 4 | 5 |
| LTVmax | 0.24 | 0.37 | 0.35 | 0.28 | 0.31 |
| Average of LTVmax | | | 0.31 | | |

COMPARATIVE EXAMPLE

Five silicon wafers were simultaneously mirror-polished according to the same procedures as in Example 1 except that using a backing pad having no groove. Results were shown in Table 2.

TABLE 2

|  | Silicon Wafer | | | | |
| --- | --- | --- | --- | --- | --- |
|  | 1 | 2 | 3 | 4 | 5 |
| LTVmax | 0.36 | 0.71 | 0.53 | 0.81 | 0.49 |
| Average of LTVmax | | | 0.58 | | |

From comparison between Tables 1 and 2, it was found that Comparative Example 1 has a larger variation in LTVmax among the wafers as well as a larger average value of LTVmax. In Example 1 on the contrary, LTVmax was less variable and gave a smaller average value. It was also confirmed that the entire surface of the wafers were polished with an advanced flatness in Example 1, whereas the wafers were concaved in their centers in Comparative Example 1.

It was thus made clear that batch polishing (simultaneous multi-wafer polishing) using a backing pad of the present invention can provide mirror-polished wafers with an advanced flatness and a good uniformity in the flatness among the wafers.

As will be clear from the foregoing explanation, a backing pad of the present invention consists of a sheeted elastic member carved on its wafer holding surface with a number of grooves. When wafers are fixed on this backing pad with aid of surface tension of water, the air and excessive water once trapped into gaps between the wafer holding surface of the backing pad and wafer backs are routed to the grooves to be discharged from behind the wafers in an automatic and quick manner. Since the polished surface of the wafers are thus supported in parallel to the polishing surface of the polishing pad during the polishing process and polishing allowance is made into an uniform thickness, it is facilitated to obtain an advanced flatness of the mirror-polished surface of the wafers.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A backing pad for fixing a wafer used in polishing of semiconductor wafers based on the waxless method, wherein the backing pad for fixing a wafer has a wafer holding surface comprising a sheeted elastic member which is carved with a number of grooves, wherein said grooves beneath each wafer held by the wafer holding surface which extend beyond each wafer edge, and wherein said sheeted elastic member is made from poromerics internally including a number of isolated pores.

2. A backing pad as set forth in claim 1, wherein said grooves are formed to extend straight toward the outer periphery of said sheeted elastic member.

3. A backing pad as set forth in claim 2, wherein said grooves are aligned in a lattice form.

4. A backing pad as set forth in claim 3, wherein all of said grooves have an uniform width and an uniform intergroove pitch.

5. A backing pad as set forth in claim 4, wherein all of said grooves have said width ranging from 0.3 mm to 3.0 mm both inclusive and said intergroove pitch ranging from 5 mm to 30 mm both inclusive.

6. A backing pad as set forth in claim 5, wherein said grooves have a greater width for a greater intergroove pitch, and a smaller width for a smaller intergroove pitch.

7. A backing pad as set forth in claim 1, wherein said sheeted elastic member is made from polyurethane poromerics internally including a number of isolated pores.

8. A method for polishing a semiconductor wafer based on the waxless method, comprising the steps of:

supporting a wafer on a backing pad being made of a sheeted elastic member and having a number of grooves which extend beyond the wafer edge on its wafer holding surface; and polishing the wafer by applying said wafer to a polishing pad.

9. A backing pad for fixing a wafer used in polishing of semiconductor wafers based on the waxless method, wherein the backing pad for fixing a wafer has a holding surface comprising a sheeted elastic member, which is carved with a number of grooves, wherein said grooves are formed to extend straight toward the outer periphery of said sheeted elastic member, and wherein said sheeted elastic member is made from polyurethane poromerics internally including a number of isolated pores.

10. A backing pad as set forth in claim 9, wherein said grooves are aligned in a lattice form.

11. A backing pad as set forth in claim 10, wherein all of said grooves have an uniform width and a uniform intergroove pitch.

12. A backing pad as set forth in claim 11, wherein all of said grooves have said width ranging from 0.3 mm to 3.0 mm both inclusive and said intergroove pitch ranging from 5 mm to 30 mm both inclusive.

13. A backing pad as set forth in claim 12, wherein said grooves have a greater width for a greater intergroove pitch, and a smaller width for a smaller intergroove pitch.

14. A backing pad as set forth in claim 9, wherein said sheeted elastic member is made from polyurethane poromerics internally including a number of isolated pores.

* * * * *